(12) United States Patent
Fuchs et al.

(10) Patent No.: US 11,946,952 B2
(45) Date of Patent: Apr. 2, 2024

(54) MEASUREMENT ARRANGEMENT

(71) Applicant: Dr. Ing. h.c. F. Porsche Aktiengesellschaft, Stuttgart (DE)

(72) Inventors: Patrick Fuchs, Leonberg (DE); Maximilian Barkow, Stuttgart (DE); Timijan Velic, Weissach (DE); Sebastian Wachter, Pressig (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 128 days.

(21) Appl. No.: 17/844,057

(22) Filed: Jun. 20, 2022

(65) Prior Publication Data

US 2022/0404397 A1 Dec. 22, 2022

(30) Foreign Application Priority Data

Jun. 21, 2021 (DE) .................... 10 2021 115 990.3

(51) Int. Cl.
  *G01R 15/14* (2006.01)
  *G01R 19/00* (2006.01)
  *H02M 1/00* (2006.01)

(52) U.S. Cl.
  CPC ....... *G01R 15/146* (2013.01); *G01R 19/0092* (2013.01); *H02M 1/0009* (2021.05)

(58) Field of Classification Search
  CPC ...... G01R 1/0458; G01R 1/44; G01R 11/185; G01R 19/32; G01R 21/14; G01R 31/2872; G01R 31/2874; G01R 31/2881
  See application file for complete search history.

(56) References Cited

U.S. PATENT DOCUMENTS

| | | | |
|---|---|---|---|
| 7,482,085 B2 * | 1/2009 | Roberts | H01M 8/2457 |
| | | | 429/413 |
| 10,786,864 B2 | 9/2020 | Wakabayashi et al. | |
| 11,346,863 B2 | 5/2022 | Wandres et al. | |
| 2007/0114665 A1 | 5/2007 | Bayerer | |
| 2012/0262151 A1 | 10/2012 | Mandic et al. | |
| 2013/0188665 A1 * | 7/2013 | Namou | B60L 50/40 |
| | | | 374/45 |

(Continued)

FOREIGN PATENT DOCUMENTS

| | | |
|---|---|---|
| DE | 102004018469 B3 | 10/2005 |
| DE | 112013007640 T5 | 8/2016 |

(Continued)

*Primary Examiner* — Tung X Nguyen
(74) *Attorney, Agent, or Firm* — LEYDIG, VOIT & MAYER, LTD.

(57) ABSTRACT

A measurement arrangement, including a current line, a first measurement location provided on the current line, a second measurement location provided on the current line, and a coolant, wherein the second measurement location is provided at a distance from the first measurement location in order to make it possible to measure a voltage in a measurement section of the current line arising due to a current flowing through the current line, wherein the measurement section is defined between the first measurement location and the second measurement location, and wherein the coolant is of fluid form and at least in areas is in direct contact with the current line in an area between the first measurement location and the second measurement location.

18 Claims, 3 Drawing Sheets

(56) References Cited

U.S. PATENT DOCUMENTS

2017/0212150 A1 7/2017 Kang et al.
2019/0204367 A1 7/2019 Frenzel et al.

FOREIGN PATENT DOCUMENTS

| DE | 102016200724 A1 | 7/2017 |
|----|---|---|
| EP | 3611738 A1 | 2/2020 |
| EP | 3693749 A1 | 8/2020 |
| EP | 3719506 A1 | 10/2020 |
| FR | 1299059 A | 7/1962 |
| JP | S43026207 B | 11/1968 |
| JP | S50149958 A | 12/1975 |
| JP | S62091862 A | 4/1987 |
| JP | S62212572 A | 9/1987 |
| JP | 2009192260 A | 3/2011 |
| JP | 2017116461 A | 6/2017 |
| JP | 2017514115 A | 6/2017 |
| SU | 696387 A1 | 11/1979 |

\* cited by examiner

MEASUREMENT ARRANGEMENT

CROSS REFERENCE TO RELATED APPLICATIONS

This application claims benefit to German Patent Application No. DE 10 2021 115 990.3, filed on Jun. 21, 2021, which is hereby incorporated by reference herein.

FIELD

The invention relates to a measurement arrangement, an electronics circuit and a vehicle.

BACKGROUND

DE 10 2004 018 469 B3 discloses a power semiconductor circuit having a flat semiconductor module, which is arranged directly on a top busbar of a current-conducting busbar arrangement, wherein a cooling device is integrated into the busbar arrangement.

DE 10 2016 200 724 A1 discloses a device for cooling a busbar having a base body and at least one cooling rib and a power circuit.

SUMMARY

In an embodiment, the present disclosure provides a measurement arrangement, comprising a current line, a first measurement location provided on the current line, a second measurement location provided on the current line, and a coolant, wherein the second measurement location is provided at a distance from the first measurement location in order to make it possible to measure a voltage in a measurement section of the current line arising due to a current flowing through the current line, wherein the measurement section is defined between the first measurement location and the second measurement location, and wherein the coolant is of fluid form and at least in areas is in direct contact with the current line in an area between the first measurement location and the second measurement location.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
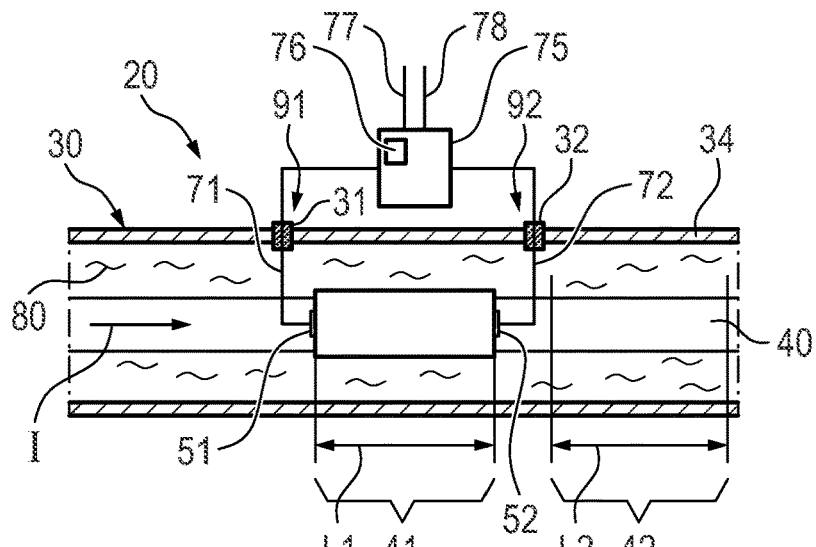
FIG. 1 shows a schematic longitudinal section of an embodiment of a measurement arrangement.

In an embodiment of the present invention, a novel measurement arrangement, a novel electronics circuit and a novel vehicle are provided.

In an embodiment, a measurement arrangement comprises a current line, a first measurement location, a second measurement location and a coolant, which first measurement location is provided on the current line, which second measurement location is provided on the current line and is at a distance from the first measurement location in order to make it possible to measure the voltage in a measurement section of the current line arising due to the current flowing through the current line, which measurement section is defined between the first measurement location and the second measurement location, and which coolant is of fluid form and at least in areas is in direct contact with the current line in the area between the first measurement location and the second measurement location. The coolant permits good cooling of the current line in the section of the measurement location and thus low influencing of the measurement by temperature effects. For example, the specific electrical resistance in many materials is thus dependent on temperature. Cooling is advantageous in particular at high currents in the current line.

According to an embodiment, the current line has a greater electrical resistance in the measurement section than in at least one first current line section outside of the measurement section, which first current line section has the same length along the current line as the measurement section. Due to the greater electrical resistance in the measurement section, a greater voltage is dropped due to the current flowing in the current line, and this increases the measurement accuracy.

According to an embodiment, the current line has a smaller cross-sectional area in the measurement section at least in sections than in the at least one first current line section. The electrical resistance in the measurement section and thus the measurement accuracy are increased due to the lower cross-sectional area.

According to an embodiment, the current line has a first material in the measurement section at least in sections and has a second material in the at least one first current line section at least in sections, which first material has a higher specific electrical resistance than the second material. Owing to this measure, the electrical resistance in the region of the measurement section is greater than when using the first material, and this increases the measurement accuracy.

According to an embodiment, the current line has the same cross-sectional area and the same material in the measurement section at least in sections as in at least one second current line section outside of the measurement section. This facilitates production, and the normal current line can be used for measurement in the measurement section at high currents I.

According to an embodiment, the measurement arrangement comprises a coolant channel having a coolant channel wall, wherein the coolant is provided in the coolant channel, and wherein the measurement section of the current line is arranged at least in sections in the coolant channel. The use of a coolant channel makes it possible to generate a flow of coolant in the coolant channel, for example through the use of a coolant pump.

According to an embodiment, the current line is arranged at least in sections outside of the measurement section in the coolant channel. The cooling of the current line outside of the measurement section decreases the electrical resistance in the current line and thus the power loss due to the flow of current through the current line.

According to an embodiment, the first measurement location is connected to a first signal line and the second measurement location is connected to a second signal line, and the first signal line and the second signal line extend through the coolant channel wall at at least one first passage location, wherein at least one first sealing element is provided for sealing the at least one first passage location. Owing to this configuration, the further signal evaluation can be performed on the outer side of the coolant channel and thus in the dry area.

According to an embodiment, the measurement arrangement comprises a signal processing device, which signal processing device is electrically connected to the first measurement location and to the second measurement location, which signal processing device is located at least in sections in the coolant channel. This configuration permits short electrical connections between the measurement locations and the signal processing device and thus a reduction in radiated interference into the electrical connection lines.

According to an embodiment, the signal processing device comprises at least one circuit element from the group of circuit elements consisting of:
amplifier,
analog-to-digital converter,
transmission module for wireless data transmission, and
voltage divider.

Amplifiers are advantageous for measurement accuracy in the case of small signals. Analog-to-digital converters facilitate the further processing in a control device. A transmission module for wireless data transmission permits (exclusively or possibly additionally) data transmission from the inner side of the coolant channel to the outer side and thus facilitates the sealing.

According to an embodiment, at least one third signal line extends from the signal processing device through the coolant channel wall at at least one second passage location, wherein at least one second sealing element is provided for sealing the at least one second passage location. With the use of a glass fiber line, a single third signal line is sufficient, for example. However, a plurality of electrical lines or else a plurality of glass fiber lines can also be provided.

According to an embodiment, the measurement arrangement is set up to measure a current in the current line with a maximum current intensity, which maximum current intensity is at least 10 A, preferably at least 50 A and particularly preferably at least 80 A. The measurement arrangement thus also makes it possible to measure high currents and is suitable for high-power power electronics systems.

According to an embodiment, at least two current lines, which each have a measurement section having a first measurement location and a second measurement location, are provided in the coolant channel.

An electronics circuit comprises at least one such measurement arrangement and it preferably comprises at least three such measurement arrangements. Such an electronics circuit makes it possible to measure the currents very accurately and it can therefore operate comparatively accurately.

According to an embodiment, the electronics circuit comprises at least one first electronics circuit from the group of electronics circuits consisting of:
AC/DC converter,
AC/AC converter,
DC/AC converter, in particular pulse inverter, and
DC/DC converter.

In these electronics circuits, an accurate measurement of the current or the currents enables very accurate conversion and the use of the measurement arrangement for this purpose has proven to be particularly advantageous.

A vehicle comprises at least one such measurement arrangement or at least one such electronics circuit. The vehicle preferably comprises at least three such measurement arrangements. In vehicles, the accurate measurement can lead to a reduction in power loss and thus to an increased range. This is particularly advantageous in vehicles.

Further details and advantageous developments of the invention will emerge from the exemplary embodiments described below and illustrated in the drawing, which exemplary embodiments should in no way be understood as restricting the invention, and also from the dependent claims. It is understood that the features mentioned above and the features yet to be discussed below may be used not only in the respectively specified combination but also in other combinations or individually without departing from the scope of the present invention. In the figures:

Identical or functionally identical parts are provided with the same reference signs below and are usually described only once. The description spans the figures such that these build on one another, in order to avoid unnecessary repetitions.

FIG. 1 shows a measurement arrangement 20 having a current line 40, a first measurement location 51, a second measurement location 52, a coolant channel 30 and a coolant 80.

The coolant channel 30 has a coolant channel wall 34 and the current line 40 is arranged in the coolant channel 30.

A current I can flow through the current line 40, which is designed as a busbar, for example. The first measurement location 51 and the second measurement location 52 define a measurement section 41 between them and, when the current I flows, a voltage is dropped in the measurement section 41 due to the electrical resistance in the measurement section 41.

The first measurement location 51 is connected to a first signal line 71 and the second measurement location 52 is connected to a second signal line 72. The first signal line 71 extends through the coolant channel wall 34 at a passage location 91 and the second signal line 72 extends through the coolant channel wall 34 at a passage location 92. Sealing elements 31, 32 are preferably provided at the passage locations 91, 92 in order to prevent or reduce a discharge of the coolant 80 out of the coolant channel 30. Outside of the coolant channel 30, the first signal line 71 and the second signal line 72 are connected to a signal processing device 75 and two signal lines 77, 78 are connected to the signal processing device 75 in order to output the signal generated in the signal processing device 75.

The signal processing device 75 preferably comprises at least one circuit element 76 from the group of circuit elements consisting of
amplifier,
analog-to-digital converter,
transmission module for wireless data transmission, and
voltage divider.

During operation, the current line 40 can be cooled by the coolant 80 and the coolant 80 is preferably of fluid form, that is to say liquid and/or gaseous. This enables a flow of coolant and thus a good transport of heat away via the coolant channel 30.

In an embodiment, the current line 40 is formed in the measurement section 41 as what is known as a shunt. A shunt is a low-impedance electrical resistor.

The current line 40 preferably has a higher specific electrical resistance in the measurement section 41 than in at least one first current line section 42 outside of the measurement section 41.

The measurement section 41 has a length L1 and the current line section 42 has a length L2 along the current line 40. If the lengths L1 and L2 are selected to be the same, the current line 40 preferably has a higher electrical resistance in the measurement section 41 than in the current line section 42 provided outside of the measurement section 41. In other words, the electrical resistance per length of the current line 40 in the measurement section 41 is greater than in at least one section of the current line 40 outside of the measurement section 41.

The current line 40 consists for example in the first current line section 42 of copper or of a copper alloy and consists in the measurement section 41 for example of Manganin, Isotan or Isabellin or of a copper alloy with a greater specific electrical resistance.

The sealing elements 31, 32 are formed for example as:
an adhesive bond,
a rubber bushing,
a lip seal, and/or
an O-ring seal.

Figure 2:
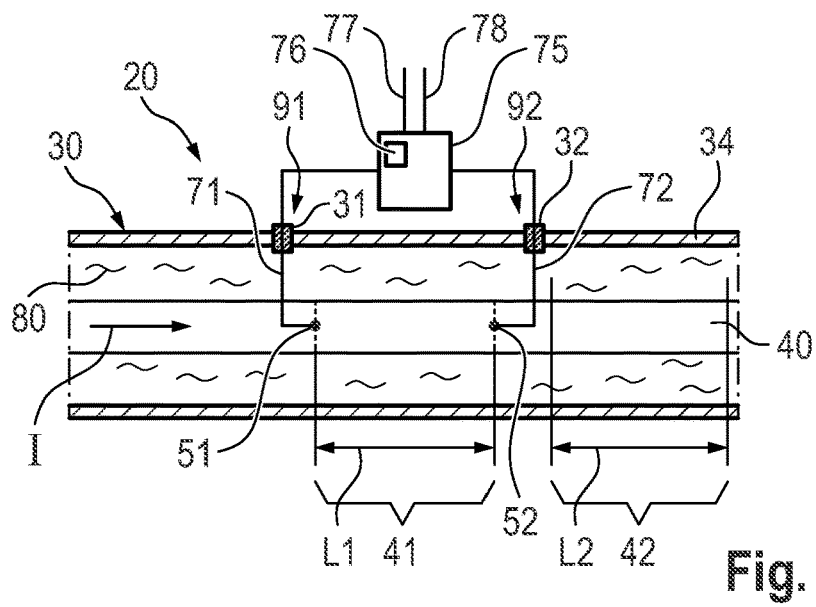
FIG. 2 shows a schematic longitudinal section of an embodiment of a measurement arrangement.

FIG. 2 shows a further embodiment of the measurement arrangement 20.

In contrast to the exemplary embodiment of FIG. 1, the current line 40 does not have a particular shunt in the measurement section 41 but the current line 40 is formed in the same way in the measurement section 41 and outside of the measurement section 41 or in particular in a current line section 42 outside of the measurement section 41. The current line 40 thus has the same material and the same cross section in the measurement section 41 and in the current line section 42.

At very high currents I, it is not necessary to provide a higher electrical resistance in the measurement section 41, and even with good conductive materials such as copper or copper alloy, a sufficient voltage is dropped in the measurement section 41 at high currents I.

In an embodiment, the cross section or the cross-sectional area in the measurement section 41 can be reduced in order to increase the electrical resistance in the measurement section 41.

Figure 3:
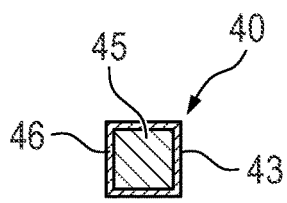
FIG. 3 shows a first cross-sectional area in a cross section through a current line.

FIG. 3 shows by way of example the current line 40 in cross section. The current line 40 has a cross-sectional area 43 and in the exemplary embodiment it has a metallic core 45, for conducting the current I, and an insulation 46, which is illustrated with an exaggerated size. The insulation 46 prevents direct contact between the coolant 80 and the metallic core 45 and thus reduces the risk of a short circuit. The insulation layer 46 is not absolutely necessary and a fluid with poor electrical conductivity can be used as coolant 80.

Figure 4:
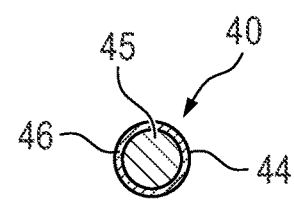
FIG. 4 shows a second cross-sectional area in a cross section through a current line.

FIG. 4 shows another cross section through the current line 40, wherein a metal core 45 and an insulation layer 46 are provided like in FIG. 3. The cross section with the cross-sectional area 44 has by way of example a round basic form and the cross-sectional area 44 is smaller than the cross-sectional area 43 of the current line 40 of FIG. 3.

By way of example, the round cross section of FIG. 4 can be provided in the measurement region 41 and the rectangular cross section of FIG. 3 can be provided outside of the measurement region 41. If the diameter of the cross-sectional area 44 corresponds to the side length of the cross-sectional area 43, the cross-sectional area 44 is smaller than the cross-sectional area 43. As a result thereof, the electrical resistance in the measurement region 41 is increased compared to the resistance in the current line section 42, which has the same length as the measurement section 41, and a greater voltage can be evaluated and the accuracy can be increased in the signal processing device 75.

Figure 5:
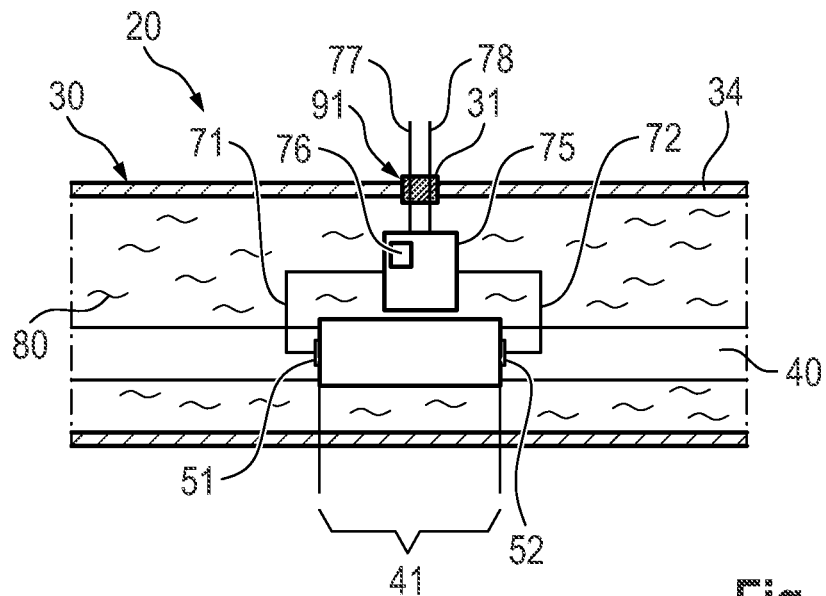
FIG. 5 shows a schematic longitudinal section of an embodiment of a measurement arrangement.

FIG. 5 shows a further embodiment of the measurement arrangement 20. In this embodiment, the signal processing device 75 is arranged in the coolant channel 30 and it can be cooled by the coolant 80 as a result. Two signal lines 77, 78 run from the signal processing device 75 through the coolant channel wall 34 to the outer side of the coolant channel 30 in order to provide there the measurement signal processed by the signal processing device 75, which measurement signal is required for example in an electrical converter. The signal lines 77, 78 are sealed at the passage location 91 by at least one sealing element 31 in order to prevent a discharge of the coolant 80 at the passage location 31.

Figure 6:
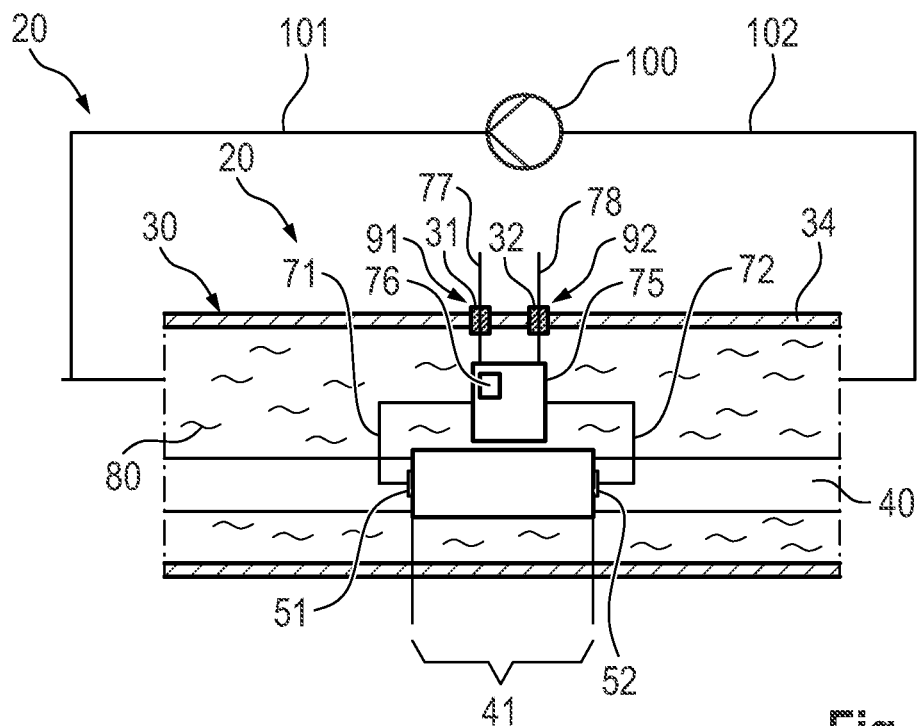
FIG. 6 shows a schematic longitudinal section of an embodiment of a measurement arrangement.

FIG. 6 shows an embodiment of the measurement arrangement 20 in which the signal lines 77 and 78 pass through the coolant channel wall 34 at two different passage locations 91, 92.

In addition, a coolant pump 100 is schematically illustrated, which can pump coolant 80 to the coolant channel 30 via a coolant line 101, and the coolant 80 can subsequently flow back to the pump 100 via a coolant line 102. This enables a coolant circuit and thus good and efficient cooling. The coolant line 101 or the coolant line 102 can additionally comprise a coolant cooler in order to dissipate heat from the coolant 80.

Figure 7:
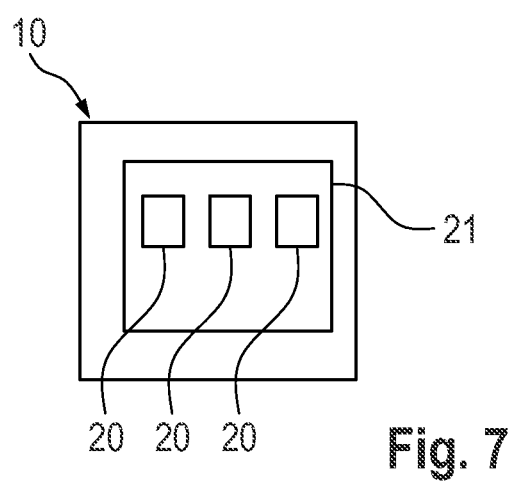
FIG. 7 shows a schematic illustration of a vehicle having an electronics circuit and having a measurement arrangement.

FIG. 7 shows a schematic illustration of an electronics circuit 21, which comprises at least one measurement arrangement 20. The electronics circuit 21 preferably comprises, as illustrated, at least three measurement arrangements 20 in order to be able to measure the current in each outer conductor in the case of a three-phase electricity network.

The electronics circuit preferably comprises at least one first electronics circuit from the group of electronics circuits consisting of:
AC/DC converter,
AC/AC converter,
DC/AC converter, and
DC/DC converter.

It is preferably a clocked converter that is involved and the DC/AC converter is preferably a pulsed DC/AC converter or a pulse inverter.

A vehicle 10 preferably has such an electronics circuit 21 or at least one such measurement arrangement 20 and preferably at least three measurement arrangements 20.

Numerous variations and modifications are of course possible within the scope of the present application.

It is thus possible for a plurality of or at least two current lines to run in the coolant channel, for example. This leads to uniform cooling and to a reduction in the overall weight.

Instead of the coolant channel, it is possible to use a well through which the current lines run.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A measurement arrangement, comprising:
   a current line;
   a first measurement location provided on the current line;
   a second measurement location provided on the current line; and
   a coolant,
   wherein the second measurement location is provided at a distance from the first measurement location in order to make it possible to measure a voltage in a measurement section of the current line arising due to a current flowing through the current line,
   wherein the measurement section is defined between the first measurement location and the second measurement location, and
   wherein the coolant is of fluid form and at least in areas is in direct contact with the current line in an area between the first measurement location and the second measurement location.

2. The measurement arrangement as claimed in claim 1, wherein the current line has a greater electrical resistance in the measurement section than in at least one first current line section outside of the measurement section, and wherein the first current line section has a same length along the current line as the measurement section.

3. The measurement arrangement as claimed in claim 2, wherein the current line has a smaller cross-sectional area in the measurement section at least in sections than in the at least one first current line section.

4. The measurement arrangement as claimed in claim 2, wherein the current line has a first material in the measurement section at least in sections and has a second material in the at least one first current line section at least in sections, and wherein the first material has a higher specific electrical resistance than the second material.

5. The measurement arrangement as claimed in claim 1, wherein the current line has a same cross-sectional area and a same material in the measurement section at least in sections as at least one second current line section outside of the measurement section.

6. The measurement arrangement as claimed in claim 1, comprising a coolant channel having a coolant channel wall, wherein the coolant is provided in the coolant channel, and wherein the measurement section of the current line is arranged at least in sections in the coolant channel.

7. The measurement arrangement as claimed in claim 6, wherein the current line is arranged at least in sections outside of the measurement section in the coolant channel.

8. The measurement arrangement as claimed in claim 6, wherein the first measurement location is connected to a first signal line and the second measurement location is connected to a second signal line, wherein the first signal line and the second signal line extend through the coolant channel wall at at least one first passage location, and wherein at least one first sealing element is provided for sealing the at least one first passage location.

9. The measurement arrangement as claimed in claim 6, comprising a signal processing device electrically connected to the first measurement location and to the second measurement location, and wherein the signal processing device is located at least in sections in the coolant channel.

10. The measurement arrangement as claimed in claim 9, wherein the signal processing device comprises at least one circuit element, the at least one circuit element being at least one of an amplifier, an analog-to-digital converter, a transmission module for wireless data transmission, and/or a voltage divider.

11. The measurement arrangement as claimed in claim 9, wherein at least one third signal line extends from the signal processing device through the coolant channel wall at at least one second passage location, and wherein at least one second sealing element is provided for sealing the at least one second passage location.

12. The measurement arrangement as claimed in claim 1, wherein the measurement arrangement is configured to measure a current in the current line with a maximum current intensity, wherein the maximum current intensity is at least 10 A.

13. An electronics circuit comprising at least one measurement arrangement as claimed in claim 1.

14. The electronics circuit as claimed in claim 13, comprising at least one first electronics circuit, the at least one first electronics circuit being at least one of a AC/DC converter, a AC/AC converter, a DC/AC converter, a pulse inverter, and/or a DC/DC converter.

15. A vehicle comprising at least one measurement arrangement as claimed in claim 1.

16. A vehicle comprising at least one electronics circuit as claimed in claim 13.

17. The measurement arrangement as claimed in claim 1, wherein the measurement arrangement is configured to measure a current in the current line with a maximum current intensity, wherein the maximum current intensity is at least 50 A.

18. The measurement arrangement as claimed in claim 1, wherein the measurement arrangement is configured to measure a current in the current line with a maximum current intensity, wherein the maximum current intensity is at least 80 A.

* * * * *